United States Patent [19]
Camarota

[11] Patent Number: 5,805,503
[45] Date of Patent: Sep. 8, 1998

[54] NON-DISRUPTIVE RANDOMLY ADDRESSABLE MEMORY SYSTEM

[75] Inventor: Rafael C. Camarota, San Jose, Calif.

[73] Assignee: Atmel Corporation, San Jose, Calif.

[21] Appl. No.: 582,516

[22] Filed: Jan. 3, 1996

Related U.S. Application Data

[63] Continuation of Ser. No. 296,616, Aug. 25, 1994, Pat. No. 5,488,582, which is a continuation of Ser. No. 907,709, Jul. 2, 1992, abandoned.

[51] Int. Cl.⁶ .................................................. G11C 13/00
[52] U.S. Cl. ................. 365/189.05; 365/200; 365/230.8
[58] Field of Search .................................... 365/200, 210, 365/189.01, 189.05, 230.08

[56] References Cited

U.S. PATENT DOCUMENTS

| | | | |
|---|---|---|---|
| Re. 23,950 | 2/1955 | Bloch et al. ............................. | 365/152 |
| Re. 34,363 | 8/1993 | Freeman ................................. | 397/465 |
| 3,461,435 | 8/1969 | Hoffman ................................. | 340/173 |
| 3,473,160 | 10/1969 | Wahlstrom ........................... | 340/172.5 |
| 3,531,662 | 9/1970 | Spandorfer ............................ | 307/303 |
| 4,020,469 | 4/1977 | Manning ............................. | 340/172.5 |
| 4,642,487 | 2/1987 | Carter ..................................... | 307/465 |
| 4,750,155 | 6/1988 | Hsieh ...................................... | 365/203 |
| 4,821,233 | 4/1989 | Hsieh ...................................... | 365/203 |
| 4,918,440 | 4/1990 | Futek .................................. | 340/825.83 |
| 5,060,145 | 10/1991 | Scheuneman et al. ............. | 365/189.04 |
| 5,088,062 | 2/1992 | Shikata ................................. | 365/189.04 |
| 5,193,071 | 3/1993 | Umina et al. ....................... | 365/189.04 |
| 5,459,690 | 10/1995 | Rieger et al. ............................ | 365/200 |

OTHER PUBLICATIONS

Robert C. Minnick, *A Survey of Microcellular Research*, Journal of the Association for Computing Machinery, vol. 14, No. 2, Apr. 1967, pp. 203–241.

*Primary Examiner*—David C. Nelms
*Attorney, Agent, or Firm*—Pennie & Edmonds LLP

[57] ABSTRACT

An apparatus and method for reprogramming a reconfigurable-logic array is provided whereby a portion of the array can be reconfigured without disrupting the operation of the entire array. Avoiding total disruption of array operation typically requires that the configuration control signals, which determine the configuration of the array, remain substantially non-disrupted during a reprogramming operation. In one embodiment, the reprogramming operates by unique decoding in which an electrical path is established only between the particular storage elements being reprogrammed, thereby avoiding disruption of the configuration control signals provided by other storage elements. In other embodiments, buffers and/or read-modify-write techniques are used to minimize disruption of configuration control signals of storage elements not being reprogrammed.

19 Claims, 11 Drawing Sheets

NON-DISRUPTIVE RANDOMLY ADDRESSABLE MEMORY SYSTEM

This is a continuation of application Ser. No. 08/296,616, filed Aug. 25, 1994 now U.S. Pat. No. 5,488,582 which is a continuation of application Ser. No. 07/907,709, filed Jul. 2, 1992, now abandoned.

1. CROSS-REFERENCE TO RELATED APPLICATION

The present application is related to U.S. patent application Ser. No. 752/282, filed Aug. 29, 1991 by inventors Garverick, Sutherland, Popli, Alturi, Smith, Pickett, Hawley, Chen, Moni, Ting, Camarota and Furtek for CONFIGURABLE LOGIC ARRAY, incorporated herein by reference.

2. BACKGROUND OF THE INVENTION

2.1. Field of the Invention

The present invention relates generally to programmable and-reconfigurable logic devices and particularly to memory systems for configuring and programming the same.

2.2. Background of the Invention

Figure 1:
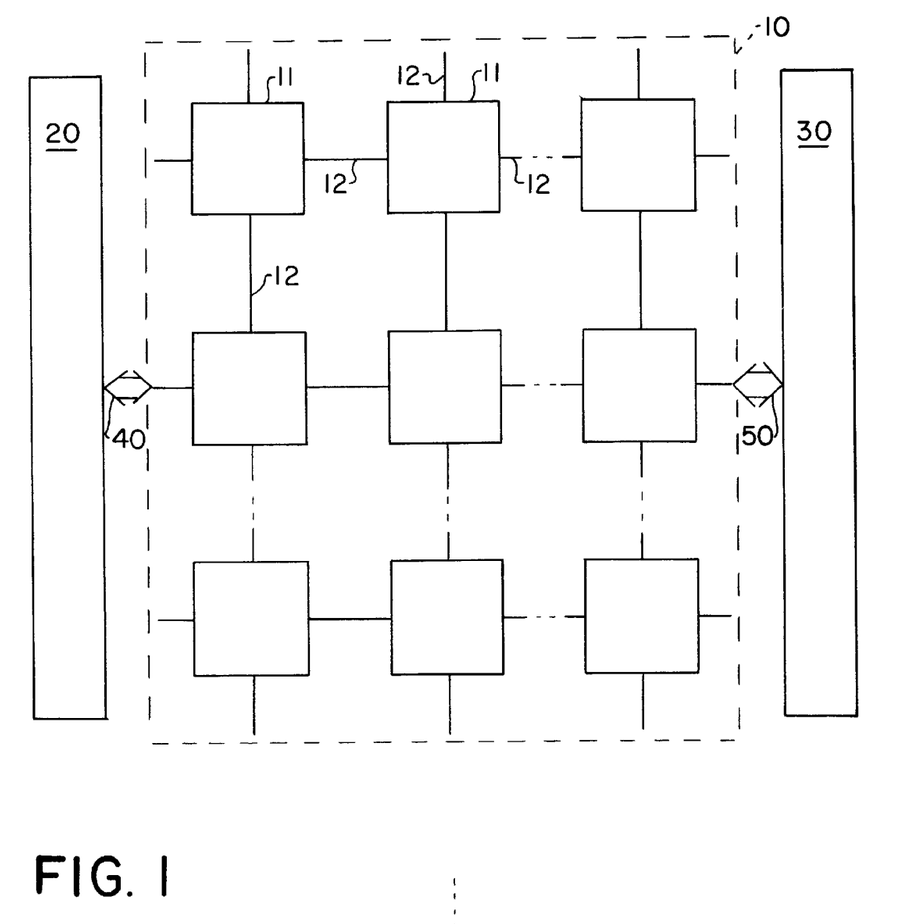
FIG. 1 depicts a typical prior art configurable logic array.

FIG. 1 is a drawing of a typical configurable logic array. The configurable logic array includes a regular array 10 of identical cells 11, an I/O means 20 which couples external I/O signals 40 to and from the array 10 and programming means 30 which couples external configuration signals 50 to and from the array 10 so as to reconfigure the array and/or ascertain its present configuration.

Figure 2:
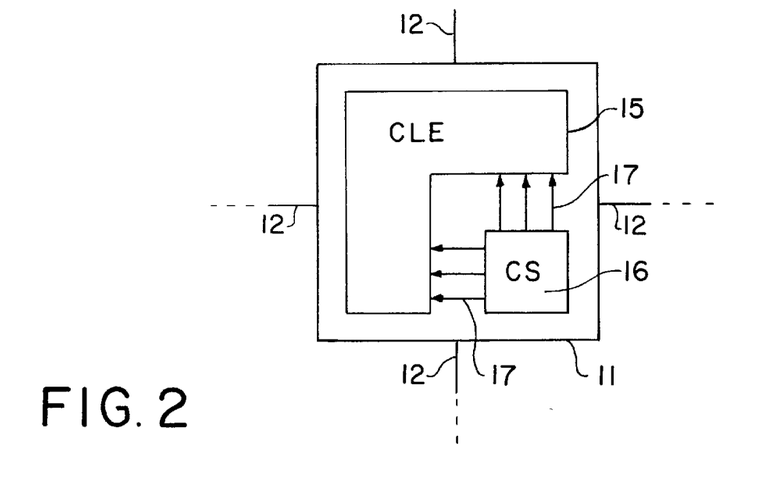
FIG. 2 depicts an exemplary embodiment of a typical cell in a prior art configurable logic array such as that shown in FIG. 1.

FIG. 2 shows a typical cell in a configurable logic array. Each cell 11 includes a configurable logic element ("CLE") 15 having, at a minimum, a simple logic gate, such as a 2-input NAND gate and means for controlling inter-cell connections 12 to the CLEs of other cells in response to configuration signals 50 from programming means 30. Such configurable logic array devices are described, for example, in U.S. Pat. Nos. 3,473,160 for "Electronically Controlled Microelectronic Cellular Logic Array" and 3,531,662 for "Batch Fabrication Arrangement for Integrated Circuits", both of which are incorporated herein by reference.

The article "A Survey of Microcellular Research" by Robert C. Minnick, *Journal of the Association for Computing Machinery*, Vol. 14, No. 2, April 1967, pp. 203–241, provides a comprehensive survey of pre-1967 configurable logic array devices, and is also incorporated herein by reference. More recent examples of configurable logic arrays can be found in U.S. Pat. Nos. 4,020,469 for "Programmable Arrays"; 4,642,487 for "Special Interconnect for Configurable Logic Array"; and 4,918,440 for "Programmable Logic Cell and Array", all of which are incorporated herein by reference.

As shown in FIG. 2, each cell 11 in a configurable logic array typically comprises a configurable logic element 15 and a control store 16. Control store 16 comprises a plurality of control store elements (each storing one bit) and provides a plurality of configuration control signals 17 to CLE 15 which control the logical configuration of CLE 15. The configuration control signals 17 may determine, for instance, the connections between various logic gates in CLE 15, the inputs to various logic gates in CLE 15, and the connections between logic gates in CLE 15 and the intercell connection terminals 12. The collective configurations of the various control stores 16 in the array 10 determines the overall behavior of array 10 with respect to I/O signals 40 coupled to and from I/O means 20.

The state of the control store elements in control store 16 is determined by configuration signals 50 coupled from programming means 30. Integrated circuit realizations of configurable logic arrays inevitably face the problem of limited pin count. Since it is important to apportion the maximum number of pins to the I/O means 20, integrated circuit configurable logic arrays typically assign as few pins as possible to the programming means 30. A widely used method for distributing configuration signals 50 throughout a configurable logic array 10 without requiring a large number of pins to implement programming means 30 involves connecting the various control stores 16 into one long shift register, as depicted in FIG. 3.

Figure 3:
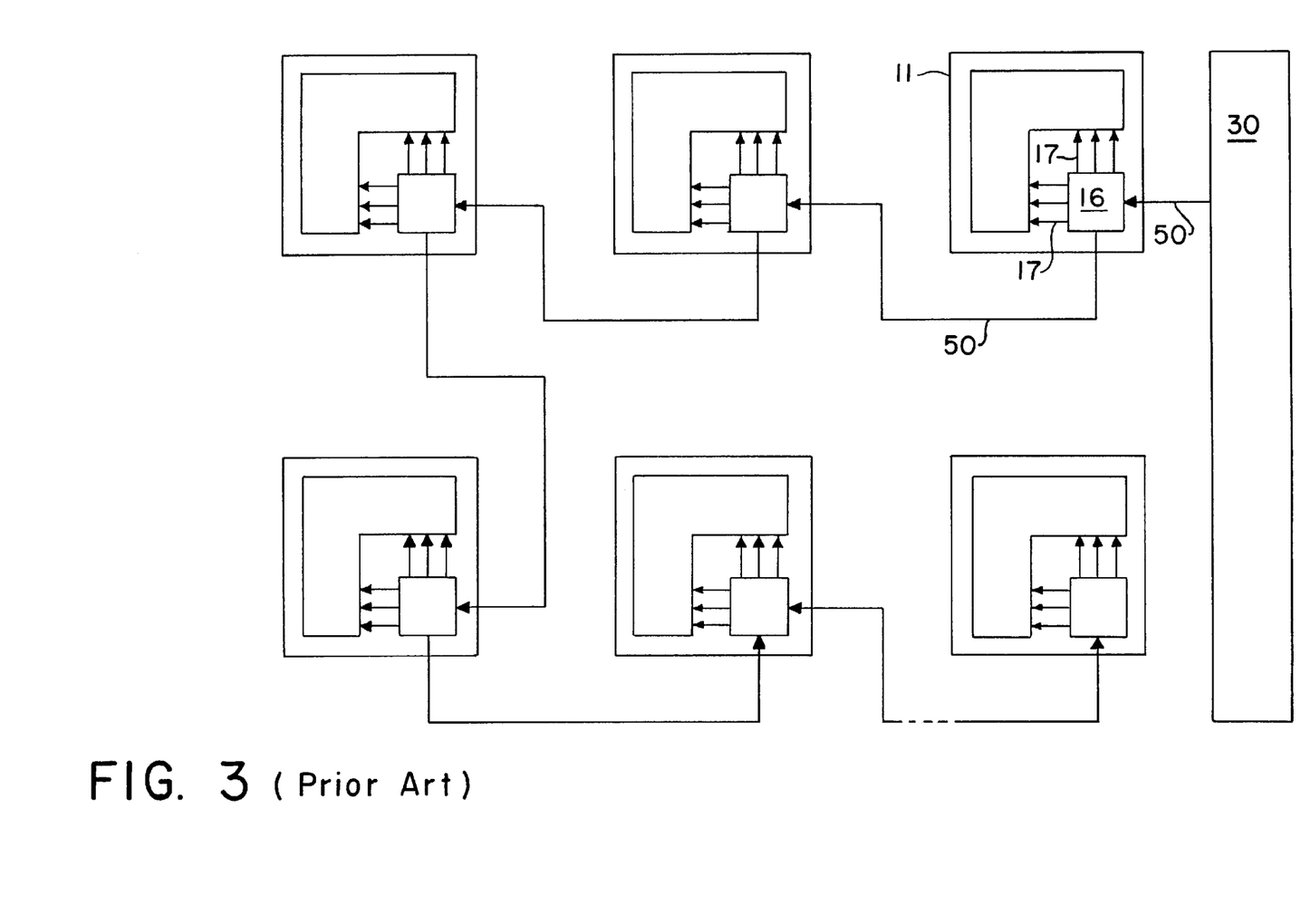
FIG. 3 depicts an exemplary prior art method, the shift register method, for distributing configuration signals to the cells in a configurable logic array, such as that shown in FIG. 1.

The method depicted in FIG. 3 is similar to that presented in U.S. Pat. No. 3,531,662, previously incorporated. In FIG. 3, each control store 16 forms one state of a shift register. The shift register stages (control stores 16) are serially connected via programming connections 50 to form one long shift register connecting all control stores 16 in the array. Thus, programming means 30 can access and program the entire array using as little as a single pin and, of course, some global system clock. The primary attraction of this arrangement is that the pin count required to implement programming means 30 is very small and, perhaps more importantly, does not increase with the size of the array. A disadvantage, however, is that distributing configuration signals via a long shift register can take a substantial amount of time, during which the array is generally not operable. Moreover, the time required to configure an array using the method of FIG. 3 increases linearly with the number of cells 11 in the array. U.S. Pat. No. 4,020,469, previously incorporated, provides a variation on the programming method of FIG. 3 in which the control store 16 of each cell 11 can be serially connected in a shift register manner to the control stores of any of four nearest-neighbor cells. This allows the shift register to "route around" defective cells in the array.

One increasingly important capability of configurable logic arrays involves dynamic reprogrammability. This allows programming means 30 to reprogram a subset of the cells 11 without disrupting the operation of other cells 11 which can continue operating, processing I/O signals 40 provided by I/O means 20. Practical applications employing dynamic reprogrammability include, for example, autonomous self-testing and adaptive filtering. In a self-testing application, a portion of the cells in an array can be configured as a state machine programmed to test for defects in other cells. In adaptive filtering applications, it frequently proves necessary to dynamically alter the length of a delay path and/or the value of a coefficient with minimal disruption in the overall operation of the filter's data path.

Figure 4:
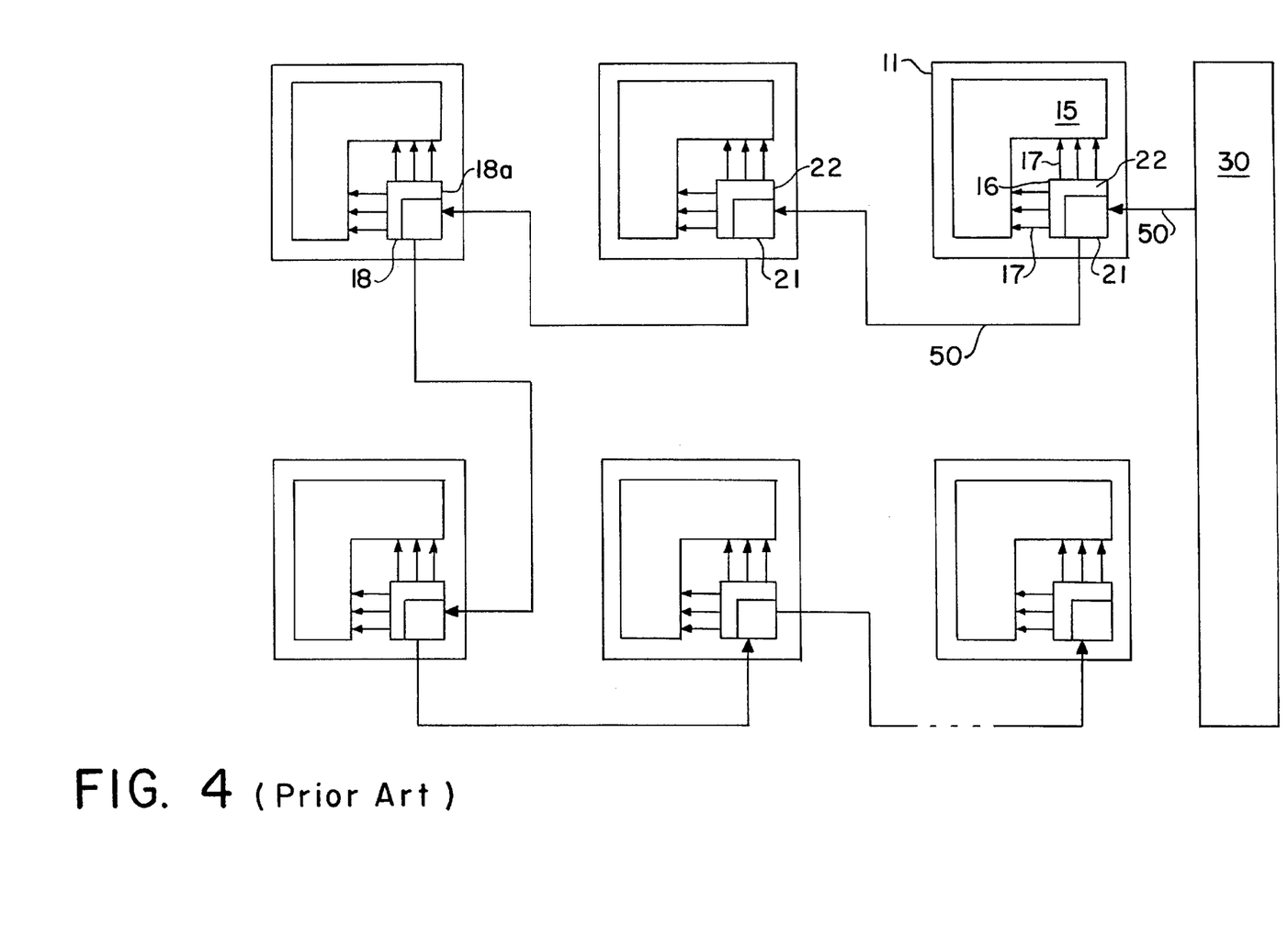
FIG. 4 depicts a prior art method for providing dynamic reprogrammability by the use of shadow registers.

FIG. 4 depicts one method for providing dynamic reprogrammability through the use of "shadow registers." In FIG. 4, each control store 16 comprises a shift register cell 21 and a shadow register cell 22. The various shift register cells 21 are serially connected via programming connections 50 to form a single long shift register, as in FIG. 3. In contrast, however, the shift register cells 21 do not directly provide configuration control signals 17 to the CLEs 15. Instead, the shadow register cells 22 latch configuration control information from the shift register cells 21 and provide configuration control signals 17 to the CLEs 15. Shadow register cells 22 latch their new states simultaneously in response to a global system clock. Thus, shadow register cells 22 prevent disruption of configuration control signals 17 while configuration signals are being serially fed into the shift register cells 21 and distributed throughout the array. Once the programming process is complete, a global system clock signals all shadow register cells to simultaneously latch in the new configuration state of the array, after which the modified configuration of the array 10 is reflected in the processing of I/O signals 40 provided by I/O means 20.

While this shadow register method allows the array 10 to continue operating and processing signals 40 from I/O means 20 while simultaneously loading in a new configuration from programming means 30, it still requires a significant amount of time to distribute the programming information throughout the array. This is a major disadvantage in, for example, adaptive systems where small changes in delay paths and/or coefficients must be made quickly in response to changing conditions. In addition, use of the shadow register method requires a backup store to retain the configurations of all the cells, even those cells which are not being reprogrammed.

Thus, there exists a present need for a control store apparatus and a method for programming such apparatus so as to allow rapid reprogramming of a subset of the control store elements without substantially disrupting the configuration control signals provided by other control store elements. There also exists a need for an apparatus and for reprogramming a subset of the control store elements without requiring knowledge (e.g., a backup store) of the state of other control store elements.

3. SUMMARY OF THE INVENTION

The present invention relates to dynamically reprogrammable configurable logic arrays and methods for programming the same. The invention comprises an improved control store including a plurality of control store elements wherein a subset of the control store elements can be dynamically reprogrammed without substantially disrupting the configuration control signals provided by other control store elements. In addition, this subset of control store elements being reprogrammed is directly addressed receiving its configuration via a direct connection to a programming means, rather than by indirect serial propagation through other control store elements.

The method of reprogramming via direct addressing substantially reduces the reprogramming latency time. That is, referring to FIG. 1, the latency between the time at which programming means 30 initiates a sequence of configuration signals via external programming connections 50 to reconfigure a subset of the cells 11 in array 10 and the time at which the new configuration of cells 11 is reflected in the operation of the array through external I/O connections 40 to and from I/O means 20. Prior art methods for reprogramming configurable logic arrays typically exhibit reprogramming latency times which increase linearly with the number of cells in the array. In the present invention, the latency associated with a reprogramming of a small subset of the cells in an array remains largely independent of the total number of cells in the array. Thus, the present invention provides a significant advantage for VLSI arrays comprising large numbers of cells.

Another advantage of the present invention is that a subset of the cells in a configurable logic array may be dynamically reprogrammed without any knowledge of the configurations of other cells. Prior art methods, such as the previously described shadow register method, typically require that the complete configuration of all control store elements be loaded onto the shift register even if only a small subset of the elements are changing their configurations. This, in turn, requires a backup store to maintain the configuration of all cells in the array. The size of this backup store, like the reprogramming latency, grows linearly with the number of cells in an array. Thus, the present invention may be employed to achieve a substantial hardware savings in VLSI systems providing dynamic reprogrammability.

Still another advantage of the present invention is that it provides the ability to ascertain the configuration of any randomly selected cell without disrupting the configuration control signals provided by any of the cells. Since such configuration information is obtained via direct addressing the associated time latency is small and largely independent of the total number of cells in the array.

4. BRIEF DESCRIPTION OF THE FIGURES

These and other features and advantages of the present invention can be better appreciated with reference to the following figures, in which:

FIG. 7 depicts a second embodiment of a control store element in accordance with the present invention adapted for use in a control store section of a configurable logic array as depicted in FIG. 9a;

5. DETAILED DESCRIPTION OF THE INVENTION

FIGS. 5, 9, 9a, and 11 depict the overall organization of the control store sections of configurable logic arrays and means for programming the same in accordance with the invention. In FIGS. 5, 9, 9a, and 11, the control store section of array 10 comprises a plurality of control store elements 16 arranged in a regular two-dimensional array. Each control store element is assumed to be associated with a particular cell 11 (as previously shown in FIG. 2) wherein the control store element 16 provides configuration control signals 17 to the cell's configurable logic element 15 which control, for example, the logic function of CLE 15 and/or its connections 12 to other cells 11. For clarity of illustration, the control store elements 16 depicted in FIGS. 5, 9, 9a, and 11 each comprise a single bit and provide two configuration control signals, a non-inverted configuration control signal 17a reflecting the state of control store element 16 and an inverted configuration control signal 17b reflecting the logical inverse of the state of control store element 16. It is understood that the single bit control store elements depicted in FIGS. 5 through 12 can easily be extended to create multiple bit control store elements by one of ordinary skill in the art. Moreover, the depiction of control store 16 in FIG. 2 as lying within the boundaries of cell 11 is merely illustrative and not meant to be limiting in any way. In general, control store 16 need only be operatively associated with a particular cell 11 so as to provide configuration control signals 17 which control the function of a configurable logic element 15 or other element not depicted such as a bus interconnection element, clock control element, reset control element or I/O element.

Figure 5:
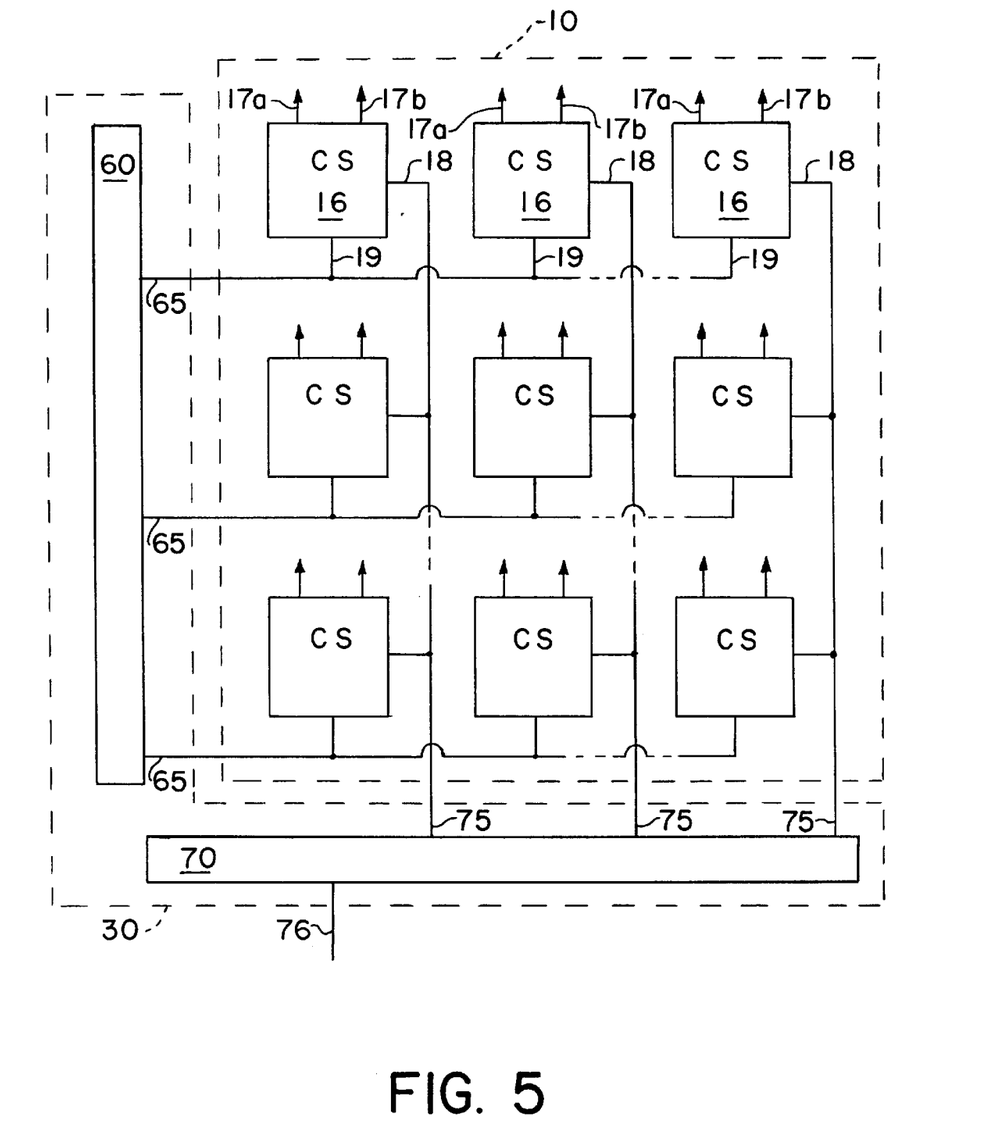
FIG. 5 is a diagram of the control store section of a configurable logic array comprising a plurality of control store elements and means for dynamically programming and reprogramming the same.

FIG. 5 depicts the overall arrangement of a control store section of an array 10 in accordance with the invention and a programming means 30 for communicating configuration signals to and from array 10 in accordance with the invention. Array 10 comprises a plurality of single bit control store elements 16 arranged in a regular two-dimensional array. Each control store element 16 provides a non-inverted configuration control signal 17a and an inverted configuration control signal 17b. For each control store element 16, signals received and/or provided at a bit line terminal 18 and a word line terminal 19 are used to communicate with programming means 30. Programming means 30 comprises a row decode means 60, a column decode means 70 and a data line 76. Programming means 30 is used to establish directly addressed connection between data line 76 and one of the control store elements 16 so as to configure the control store element 16 in accordance with a signal provided through data line 76 or to download the present configuration of the control store element 16 to data line 76. Row decode means 60 comprises a plurality of word lines 65. Each word line 65 connects the word line terminals 19 of all control store elements 16 in a particular row with row decode means 60. Row decode means 60 typically asserts a signal on only one of the word lines 65 at any given time.

Column decode means 70 similarly comprises a plurality of bit lines 75. Each bit line 75 connects the bit line terminals 18 of each control store element 16 in a given column with column decode means 70. Column decode means 70 is used to, among other things, establish an electrical connection between one of the bit lines 75 and the data line 76.

FIGS. 6, 7, 10 and 12 each show different embodiments of a control store element wherein the state of the control store element can be reprogrammed ("written") without disrupting the configuration control signals provided by other control store elements to the reconfigurable logic, and can be queried to ascertain its configuration ("read") without disrupting the configuration control signals provided by any cell, including that cell being read.

Conventionally, the control store elements 16 in FIG. 5 might consist of, for example, a bistable latch and a switch.

A signal asserted by row decode means 60 on one of the word lines 65 would activate switches thereby connecting all bistable latches in a particular row to their respective bit lines 75 through the bit line terminals 18. Column decode means 70 would be used to connect one of the bit lines 75 to the data line 76 so as to allow a read or write operation through data line 76 at the particular cell identified by the intersection of the active word line 65 and bit line 75.

Column decode means 70 might also be required to precharge the various bit lines 75. Precharging is used to establish a particular voltage on each of the various bit lines 75 prior to the time at which row decode means 60 asserts a signal on one of the word lines 65 which causes the control store elements 16 associated with the particular word line 65 to connect to their respective bit lines 75. Precharging prevents the charge associated with the capacitance of the unselected bit lines (i.e., those in columns not being read or written via column decode means 70) from undesirably changing the state of various unselected control store elements.

Although the conventional precharging technique is sufficient to ensure that the state of a bistable latch will not be inadvertently altered, it is not sufficient to prevent disruption of the configuration control signals (e.g., 17a and 17b) provided at the latch outputs. Since these configuration control signals are frequently used to drive the gates of pass transistor switches and such switches may be serially cascaded, in which case, the maintenance of stable logic levels at the gates of the switches is particularly critical, the tolerances on the configuration control signals necessary in order to avoid disruption of the operation of various configurable logic elements involve substantially more constraints than merely maintaining discernable logic levels. Configuration control signals may also be used to drive input terminals of logic gates, in which case substantial disruptions in the configuration control signals can undesirable decrease the performance of the logic gates. Accordingly, the notion of a substantial disruption in a configuration control signal shall refer to a disruption of a magnitude such that the disruption is capable of causing a deleterious functional or timing-related side effect in the performance of any configurable logic element controlled by the configuration control signal.

The control store element embodiments depicted in FIGS. 6, 7, 10 and 12 each employ a different structure to realize the goal of providing non-disrupted configuration control signals. Each has particular advantages in terms of size, speed, compatibility with particular fabrication technology and design tolerances. The embodiments are discussed in the order of decreasing transistor count necessary for a CMOS implementation, in which: control store element 80 of FIG. 6 requires nine transistors; control store element 90 of FIG. 7 requires eight transistors; control store element 110 of FIG. 10 requires seven transistors; and control store element 120 of FIG. 12 requires six transistors.

Figure 6:
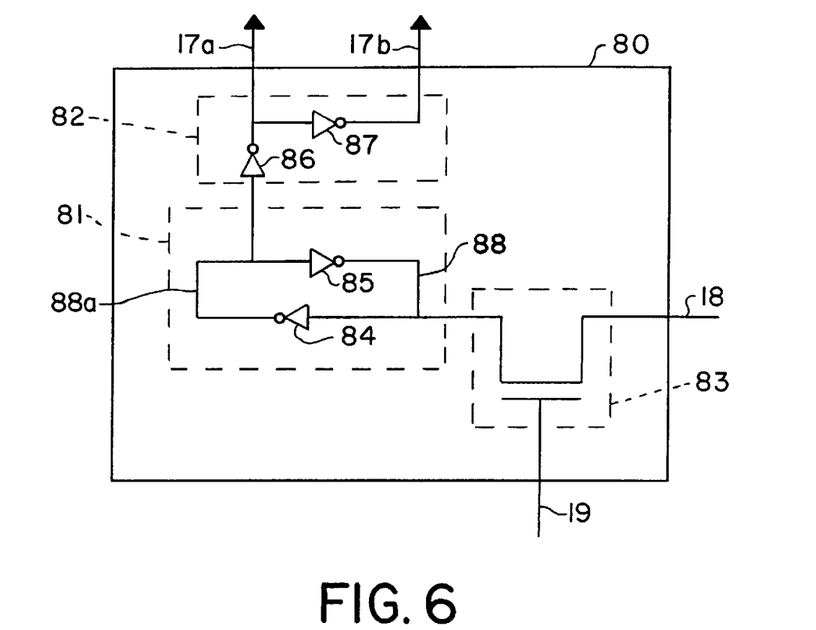
FIG. 6 depicts a first embodiment of a control store element in accordance with the present invention adapted for use in a control store section of a configurable logic array as depicted in FIG. 5.

FIG. 6 depicts a control store element 80 for use in a control store 10 of the type depicted in FIG. 5. Control store element 80 avoids disruption of non-inverted configuration control signal 17a and inverted configuration control signal 17b through the use of a control signal buffer 82. Control store element 80 comprises a bistable latch 81 for maintaining at a storage node 88 the state of the cell, a switch 83 for connecting the storage node to a bit line 75 and the control signal buffer 82 for buffering the configuration control signals. Bistable latch 81 comprises a first inverter 84 and a second inverter 85 connected in a back-to-back feedback configuration so as to provide two stable logical states, the high voltage state at storage node 88 corresponding to a logical "1" and the low voltage state at storage node 88 corresponding to a logical "0."

During a read operation, switch 83 connects storage node 88 to the bit line terminal 18 in response to a signal asserted at the word line terminal 19. Column decode means 70 then connects the selected bit line 75 to the data line 76. During a write operation, switch 83 is similarly activated in response to a signal provided at the word line terminal 19 and connects the bit line terminal 18 to the storage node 88. Column decode means 70 provides a signal from data line 76 to the selected bit line 75 sufficient to drive the state of the selected storage node 88 into the desired state. Proper operation of control store element 80 will generally require that the unselected bit lines 75 be precharged, so that the other control store elements 16 in the same row as that of the selected element do not undergo inadvertent changes in the state of storage node 88.

As with a conventional static memory cell, the voltage levels at the internal nodes 88 and 88a of bistable latch 81 may be substantially disrupted, despite the precharging by column decode means 70 which merely assures that the logical values of these nodes do not inadvertently change. To provide the non-disrupted configuration control signals 17a and 17b, control signal buffer 82 is disposed between node 88a of bistable latch 81 and the control signal output terminals 17a and 17b. Control signal buffer 82 comprises a first inverting buffer 86 and a second inverting buffer 87. Buffers 86 and 87, by virtue of their very high gain, effectively isolate the disruptions in the signal at node 88a and provide stable, non-disrupted configuration control signals 17a and 17b. Where tolerances on the stability of configuration control signals 17a and 17b are particularly critical, hysteresis may be added to the first inverting buffer, thus further isolating disruptions at node 88a from the configuration control signals provided at terminals 17a and 17b.

Figure 7:
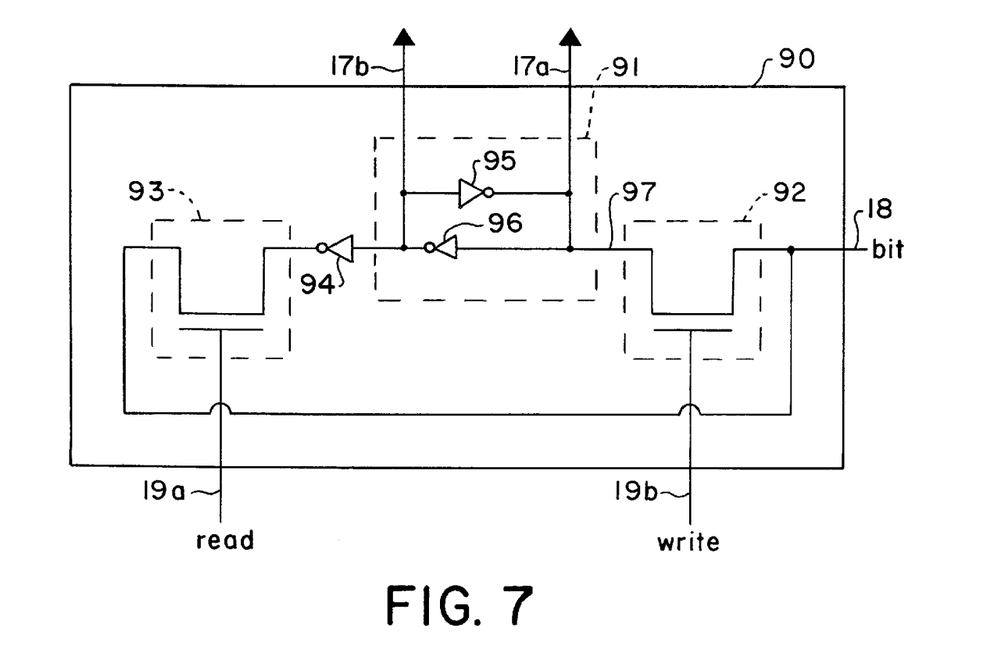
Figure 9:
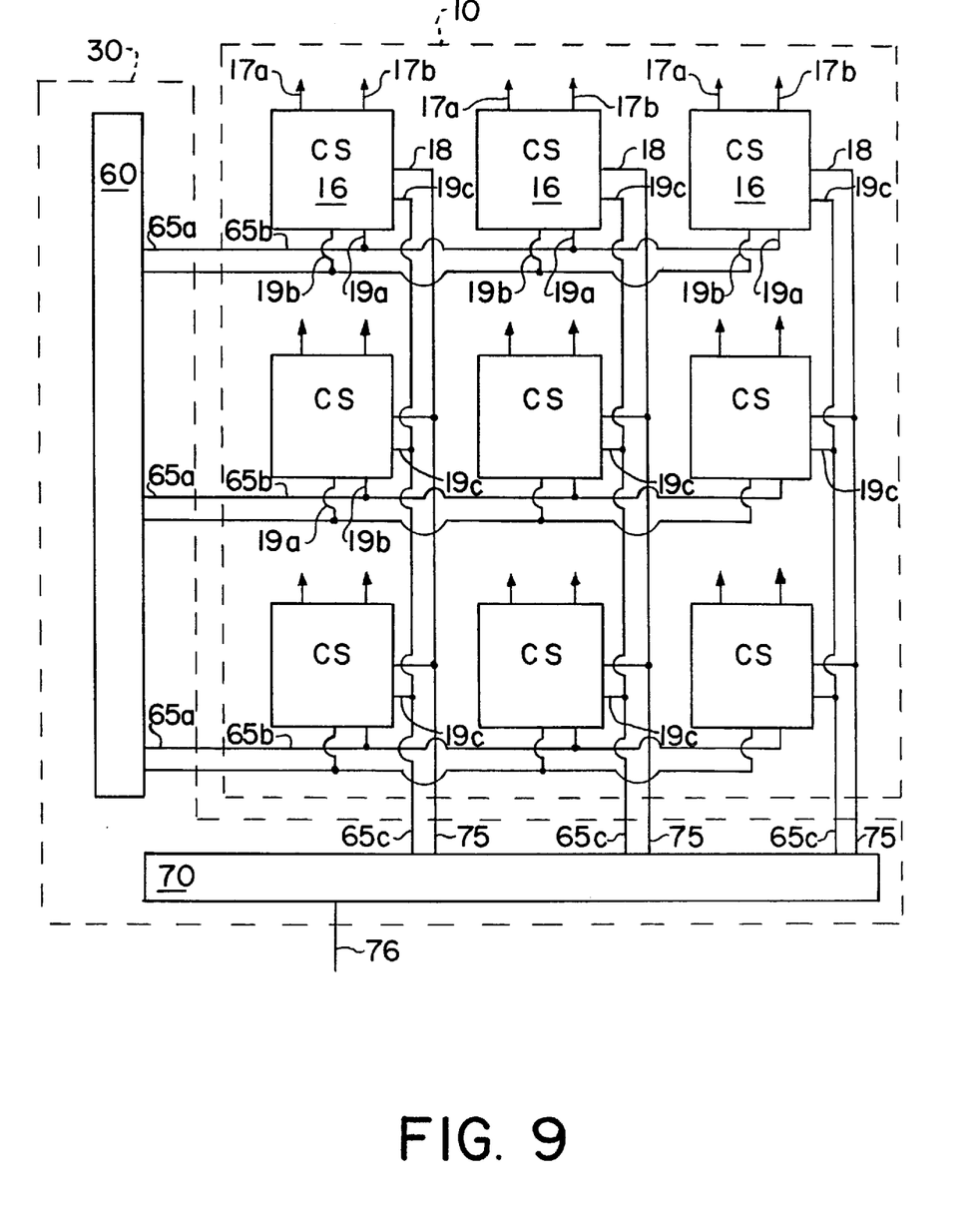
FIG. 9 is a modification of the control store section of a configurable logic array as depicted in FIG. 5 but including column decode word lines and separate read and write word lines.
Figure 9A:
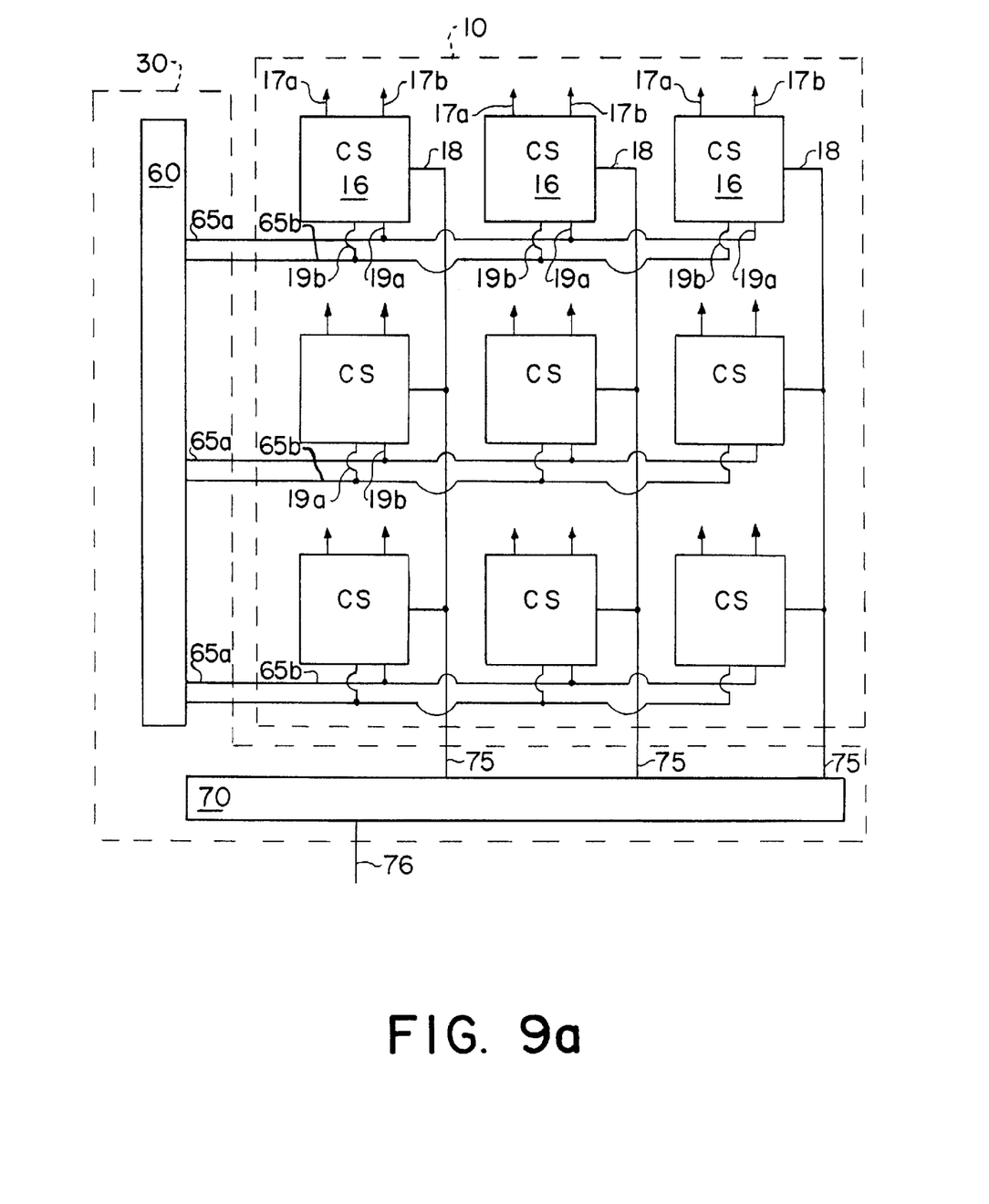
FIG. 9a is a modification of the control store section of a configurable logic array as depicted in FIG. 5 but including separate read and write word lines.

FIG. 7 shows a second embodiment of a control store element 90 useful in a control store 10 of the type depicted in FIG. 9a and capable of providing non-disruptive read and write operations in accordance with the invention. Control store element 90 comprises a bistable latch 91, a write switch 92, a read switch 93 and a read buffer 94. Control store element 90 provides a non-inverted configuration control signal at terminal 17a and an inverted configuration control signal at terminal 17b and communicates with programming means 30 through a read word line terminal 19a, a write word line terminal 19b and a bit line terminal 18. For each control store element 90, a single word line 65a from row decode means 60 connects to each read word line terminal 19a and a different word line 65b from row decode means 60 connects to each write word line terminal 19b of the cells in a single row. One bit line 75 from column decode means 70 connects the bit line terminals 18 for all control store elements 90 in a single column.

Figure 8:
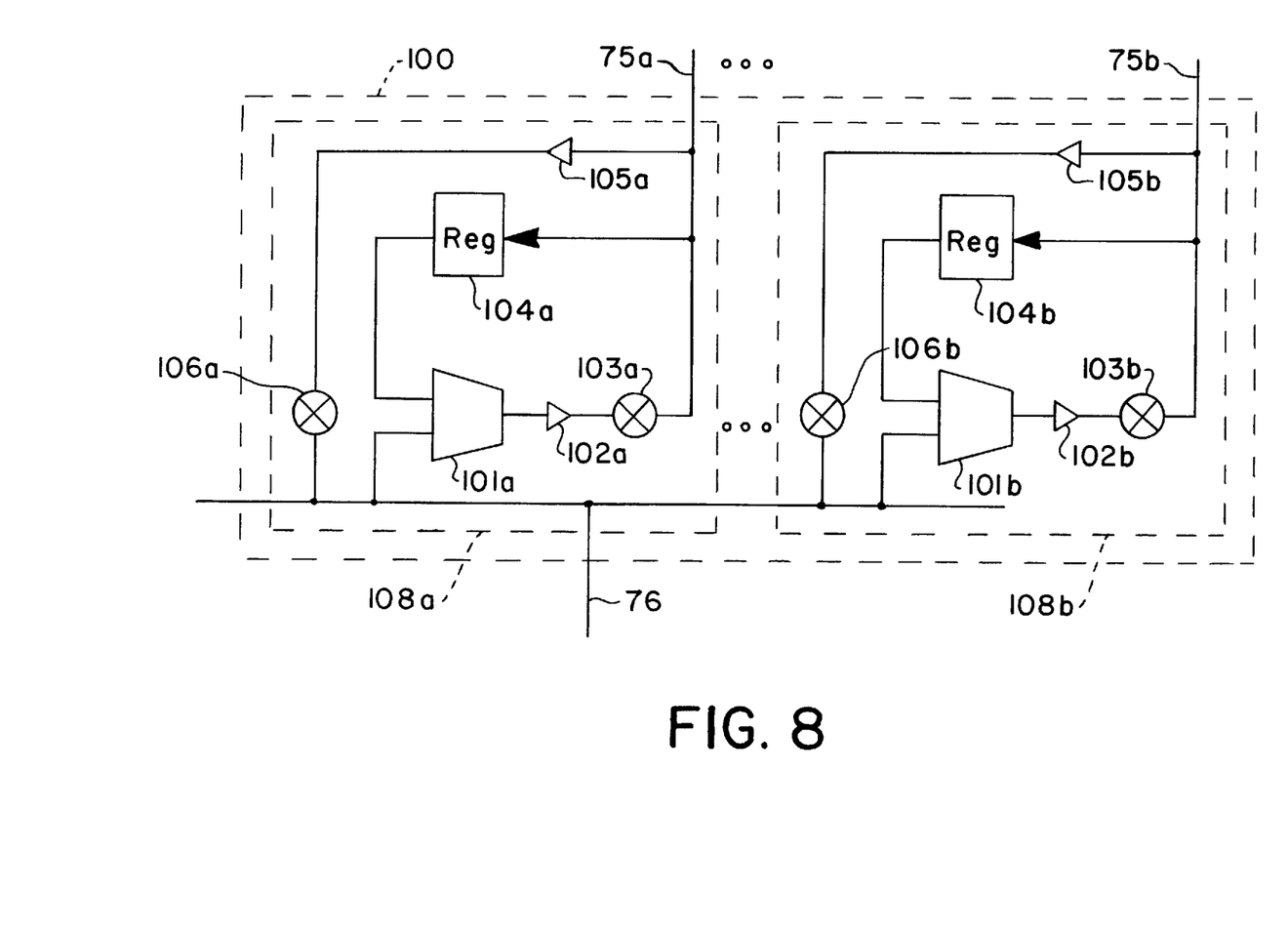
FIG. 8 depicts a column decode circuit for use in combination with an array of control store elements of the type shown in FIG. 7.

To achieve a non-disruptive write using control store element 90, column decode means 70 comprises a read-modify-write column decoder 100, as shown in FIG. 8. The non-disruptive read operation of control store element 90 requires no specialized functionality in column decode means 70. Thus, the description of the operation of control store element 90 begins with the read operation.

During a read operation, row decode means 60 asserts a signal on the read word line 65a (FIG. 9a) that connects the read word line terminals 19a of the control store elements 90 in the row containing the control store element to be read. All other word lines 65a and 65b remain non-asserted. The signal at read word line 19a causes read switch 93 to become conducting. The state of control store element 90 is held at storage note 97 (which provides configuration control signal 17a). This state is provided at bit line terminal 18 via a signal path beginning with the second inverter 96 of bistable latch 91 and continuing with read buffer 94 followed by read switch 93 and ending at bit line terminal 18. Because read buffer 94 allows only unidirectional signal flow from bistable latch 91 to read switch 93 and because right switch 92 remains in a non-conducting state during the read operation, charge associated with the capacitance at bit line terminal 18 cannot disrupt the configuration control signals provided at terminals 17a and 17b during a read operation. Moreover, control store element 90 does not require that bit lines 75 be precharged for the read operation. The value read onto bit line 75 is buffered by read buffer 105a and provided to data line 76 by enabling a read switch 106a in decoder cell 108a (all shown in FIG. 8, described below).

The non-disruptive write of control store element 90 is accomplished using the read-modify-write column decoder 100 shown in FIG. 8 to temporarily maintain the state of other control store elements 90 in the same row as that being written. Read-modify-write column decoder 100 comprises a plurality of decoder cells (two are shown, 108a and 108b), one for each bit line 75. During a write operation, the decoder cells perform one of two possible functions depending on whether the associated bit line is that of the cell being written or that of a cell in some other column.

Referring to FIG. 8, assume that bit line 75a connects to the column containing the control store element 90 being written. Bit line 75b and the bit lines associated with all remaining decoder cells (not shown) connect to columns not containing the control store element 90 being written. The non-disruptive write of a particular control store element 90 entails a three phase read-modify-write cycle as follows:

1. Read Phase.

Row decode means 60 asserts a signal on the word line 65a that connects with the read word line terminals 19a corresponding to the row of the control store element 90 to be written. In response, all control store elements in the row provide their present state at bit line terminals 18, which connects to bit lines 75a and 75b. Read-modify-write decoders 108a and 108b latch the values at bit lines 75a and 75b into registers 104a and 104b, respectively.

2. Modify Phase.

The previously asserted signal at read word line terminals 19a terminates, thereby disconnecting control store elements 90 from bit lines 75a and 75b. Read-modify-write decoder 108a, which corresponds to the column of the control store element to be written, is configured so as to provide data line 76 at the output of write select MUX 101a. Write switch 103a is set in a conducting state so as to allow write buffer 102a to drive bit line 75a with the output from write select MUX 101a. This asserts the logical value of data line 76 on bit line 75a. Read-modify-write column decoder 108b, and all other such decoders corresponding to columns not containing the control store element to be written, are configured so as to provide the previously latched value in register 104b to the output of write select MUX 101b. Write switch 103b is set in a conducting state so as to allow write buffer 102b to drive bit line 75b with the logical value stored in register 104b. Thus, at the end of the modify phase, bit line 75a will be driven by a signal corresponding to the logical value of data line 76 while bit line 75b and other such bit lines will be driven by a signal corresponding to the logical value latched from the previous read phase.

3. Write Phase.

While the state of bit lines 75a and 75b remains as defined at the end of the modify phase, row decode means 60 asserts a signal on the word line 65b that connects to the write word line terminals 19b in the row containing the control store element to be written. This signal causes the write switches 92 of the corresponding control store elements 90 to become conducting. Thus, storage node 97 in the control store element 90 to be written will be driven by bit line 75a into the state corresponding to the logical value at data line 76. The value at storage node 97 in other control store elements will remain largely non-disrupted since the logical value being input through bit line terminal 18 remains the same as that presently stored at such storage nodes 97. Thus, the configuration control signals provided at terminals 17a and 17b of such cells (those not being written) remain substantially non-disrupted. The write phase ends by terminating the signal on the write word line terminals 19b, thereby latching in the new value stored from bit line 75a.

A CMOS implementation of control store element 90 requires eight transistors per element. While some extra hardware is also required to implement the read-modify-write column decoder 100, precharging of the bit lines 75 is not necessary, unlike the previously described nine transistor element 80. It may also be advantageous to overlap or "pipeline" the read, modify and/or write phases of the read-modify-write cycle. Such techniques are well known in the art.

FIG. 9 shows a modification of the control store shown in FIG. 5. one modification pertains to the inclusion of separate read and write word lines (65a and 65b, respectively), as are also present in FIG. 9a and are required, for example, to drive the seperate read and write word line terminals (19a and 19b, respectively) of control store element 90, as previously described. A more significant difference involves the addition of column decode word lines 65c which facilitate the use of unique decoding, as explained below.

Figure 10:
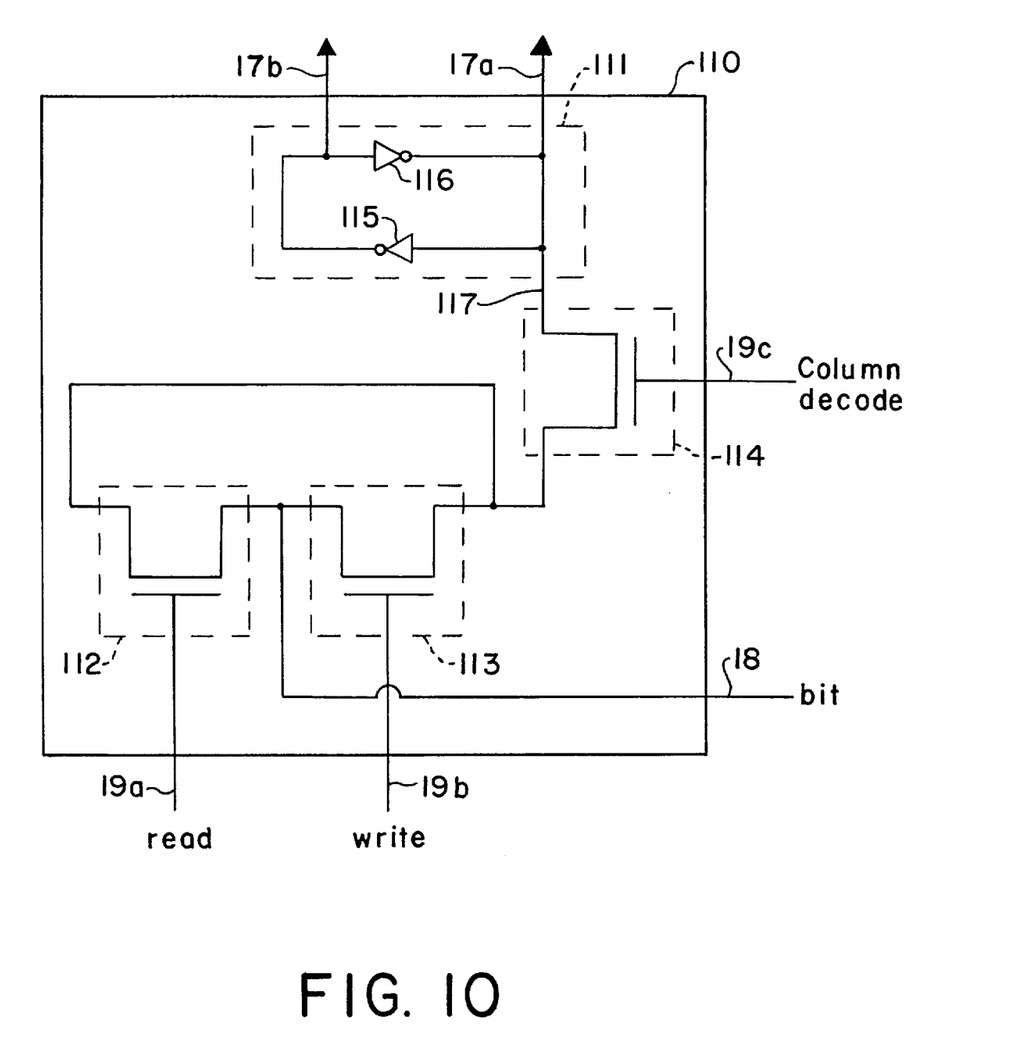
FIG. 10 depicts a third embodiment of a control store element in accordance with the present invention adapted for use in a control store section of a configurable logic array as depicted in FIG. 9; and, FIG. 11 is a modification of the control store section of a configurable logic array as depicted in FIG. 5 but including column decode word lines.

The control store element 110 shown in FIG. 10, useful in a control store of the type depicted in FIG. 9, provides non-disrupted configuration control signals at terminals 17a and 17b through the use of unique decoding and requires seven transistors per element for a CMOS implementation. Unique decoding involves adding additional decode circuitry to each element in order to maintain electrical isolation between the bit lines and the storage nodes of all cells other than that being read or written, so as to eliminate the source of disruption in such cells. In an array of control store elements 110, a read word line 65a (FIG. 9) connects row decode means 60 with the read word line terminals 19a of the cells in each row while a write word line 65b (FIG. 9) connects row decode means 60 to the write word line terminals 19b of each element in the row. Similarly, one bit line 75 connects column decode means 70 with the bit line terminals 18 of each control store element in a given column and a column decode word line 65c (FIG. 9) connects column decode means 70 with the column decode terminals 19c of each element in the column.

Control store element 110 comprises a bistable latch 111, a read switch 112, a write switch 113 and a column decode switch 114. Bistable latch 111 comprises a first inverter 115 and a second inverter 116 arranged in a feedback configuration to maintain the state of control store element 110 at storage node 117. Bistable latch 111 provides the non-inverted configuration control signal at terminal 17a and the inverted configuration control signal at terminal 17b. Switches 112, 113 and 114 are arranged so as to provide a conduction path between bit line terminal 18 and storage node 117 whenever either both the read switch 112 and the column decode switch 114 are conducting or both the write switch 113 and the column decode switch 114 are conducting.

During the write operation, row decode means 60 asserts a signal on the write word line 65b that connects with the write word line terminal 19b of the control store element to be written. Column decode means 70 simultaneously asserts a signal on the column decode word line 65c that connects to the column decode terminal 19c of the cell to be written. As a result, the write switches 113 of all control store elements 110 in the same row as that being written will become conducting while the column decode switches 114 of all control store elements 110 in the same column as that being written will also become conducting. However, only for the unique control store element 110 to be written will both the write switch 113 and the column decode switch 114 be conducting, thereby establishing an electrical conduction path between bit line terminal 18 and storage node 117. Column decode means 70 also provides a connection between data line 76 and the bit line 75 that connects to the bit line terminal 18 of the control store element 110 to be written, so as to assert the logical value from data line 76 at bit line terminal 18. In the control store element to be written, write switch 113 and column decode switch 114 provide an electrical conduction path with impedance sufficiently low to allow the state of storage node 117 to change in accordance with the signal asserted at bit line terminal 18. Since no other control store element 110 forms such an electrical conduction path between bit line terminal 18 and storage node 117 during the write operation, all such other cells avoid substantial disruption of the configuration control signals provided at terminals 17a and 17b.

The read operation of control store element 110 is similar to the previously described write operation. The difference is that row decode means 60 asserts a signal on the read word line 65a that connects to the read word line terminal 19a of the control store element 110 to be read rather than the write word line terminal 19b. Column decode means 70 also asserts a signal on the column decode word line 65c that connects to the element to be read. Column decode means 70, rather than driving the bit line 75 that connects to the bit line terminal 18 of the cell to be written, provides a connection between the bit line 75 which connects to the bit line terminal 18 of the cell to be read and the data line 76, thereby allowing the signal asserted at bit line terminal 18 to drive the logical value of data line 76. Thus, the state of control store element 110 is read via connection provided by column decode switch 114, read switch 112, bit line 75 and column decode means 70. The impedance of read switch 112 is kept sufficiently high to ensure a non-destructive read operation. As with the write operation, the unique decoding of only a single control store element assures that none of the configuration control signals provided by other control store elements are substantially disrupted during the read operation of control store element 110.

Substantial disruption of the configuration control signals provided by the cell being read, can be avoided by advantageously selecting a read switch 112 which provides a relatively high on resistance. Thus, the difference between read switch 112 and write switch 113 is that read switch 112 maintains a substantially higher resistance in the conducting state. By selecting a read switch 112 that maintains a resistance between bit line terminal 18 and storage node 117, during the read operation, of substantially greater magnitude than the output resistance of the second inverter 116, disruption of the voltage at storage node 117 caused by the charge on bit line 75 can be reduced.

Figure 11:
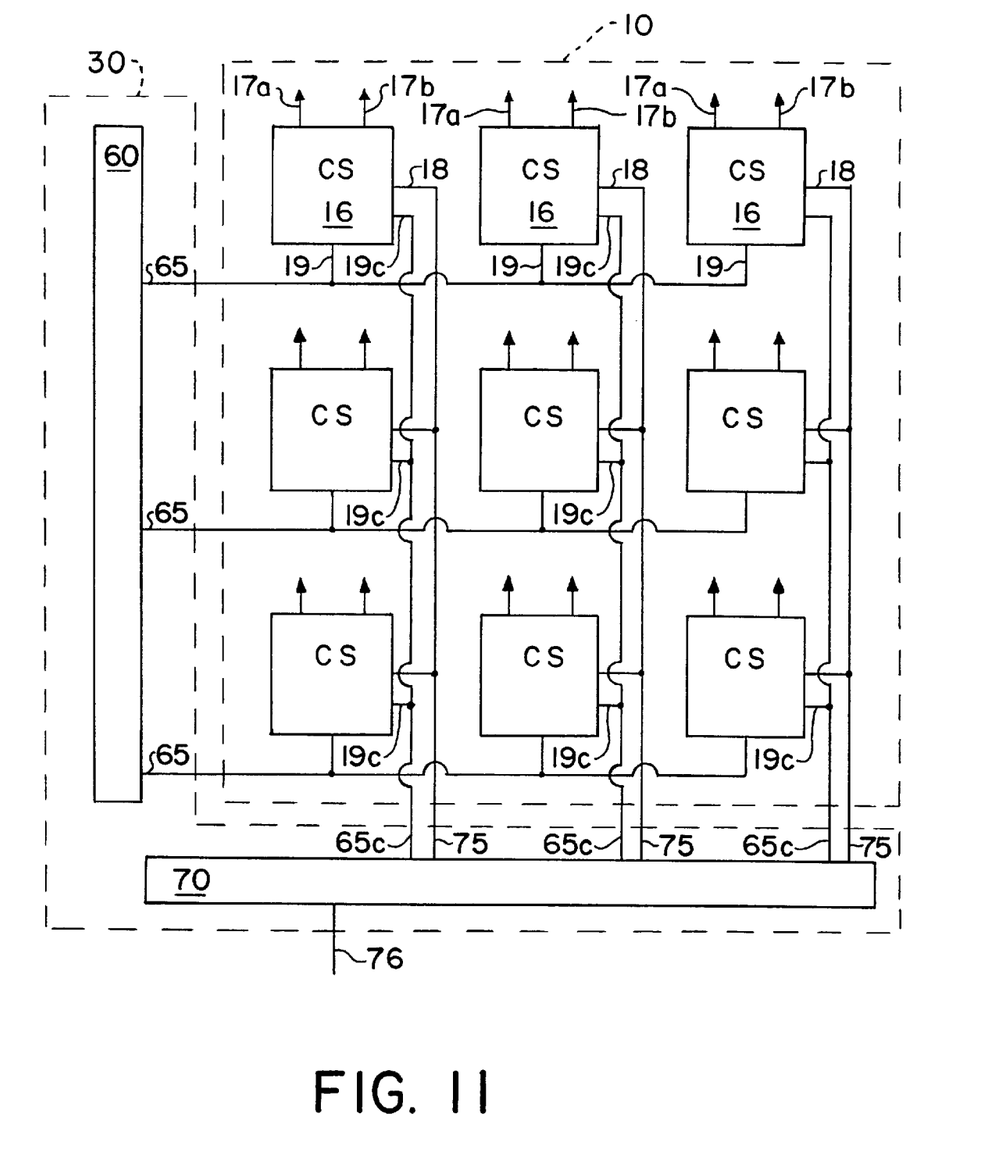

FIG. 11 is a drawing of a control store section of a configurable logic array. Like FIG. 9, FIG. 11 includes the column decode word lines 65c. Unlike FIG. 9, FIG. 11 does not include separate read and write word lines but merges both into a single word line 65.

Figure 12:
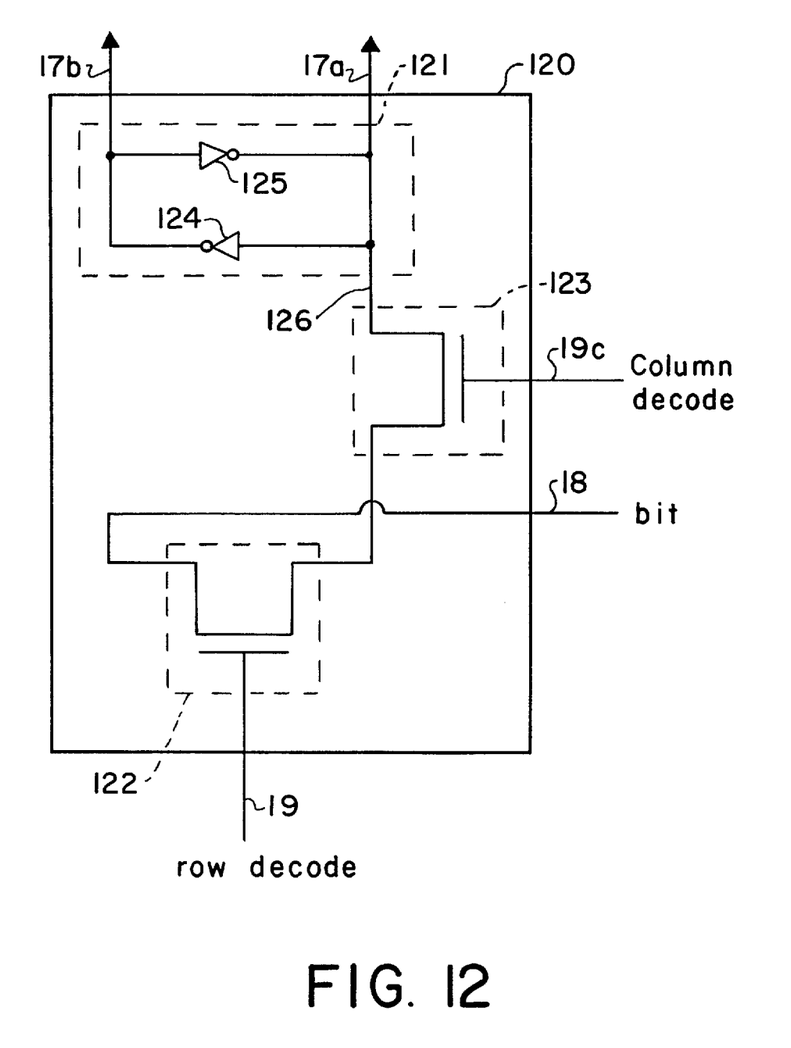
FIG. 12 depicts a fourth embodiment of a control store element employing unique decoding in accordance with the present invention and adopted for use in a control store section of a configurable logic array as depicted in FIG. 11.

FIG. 12 shows a fourth embodiment of a control store element 120 for use in a control store as depicted in FIG. 11 and capable of providing non-disrupted configuration control signals in accordance with the invention. Control store element 120 comprises a bistable latch 121, a row decode switch 122 and a column decode switch 123. Bistable latch 121 comprises a first inverter 124 and a second inverter 125 connected in a feedback configuration so as to hold the state of control store element 120 at storage node 126. Bistable latch 121 also provides a non-inverted configuration control signal at terminal 17a and an inverted configuration control signal at terminal 17b.

As with the previously described control store element 110, row decode switch 122 and column decode switch 123 cooperate to establish a unique decoding wherein only the control store element being read or written maintains a conducting electrical path between storage node 126 and bit line terminal 18. Thus, the configuration control signals at terminals 17a and 17b provided by control store elements other than that being read or written will not be disrupted during the read or write operation.

The difference between control store element 120 and 110 is that control store element 120 employs the same electrical path between storage node 126 and bit line terminal 18 for both the read and write operations. This eliminates the need for one transistor to implement read switch 112. A CMOS implementation of control store element 120 requires only six transistors per element. However, control store element 120 requires that column decode means 70 precharge the bit line 75 which connects to the bit line terminal 18 of a cell being read in order to minimize disruption of the configuration control signals provided by that cell and insure that the state of storage node 126 does not change as a result of charge on bit line 75 during the read operation.

The embodiments of control store elements shown in FIGS. 6, 7, 10 and 12 merely represent examples of such elements capable of providing non-disruptive read and/or write operations in accordance with the present invention. Those of skill in the art will appreciate that numerous alternative embodiments of the present invention may be derived by, among other things, changing the circuit technology, array structure, method of association between control store elements and configurable logic elements, external I/O means, or external programming means. Accordingly, the scope of the present invention shall be defined only in accordance with the following claims.

What is claimed is:

1. A non-disruptive, randomly addressable memory system comprising:
   a plurality of control store elements arranged in a first array;
   each of the control store elements in the first array programmable into at least two states, and having means for outputting a control signal representative of the state of the control store element;
   a plurality of circuit elements arranged in a second array;
   each of the control store elements in the first array associated with and coupled to a particular one of the circuit elements in the second array;
   each of the circuit elements in the second array performing one of a plurality of functions as specified by the control signal generated by the control store element associated with that circuit element; and
   means for programming a subset of the control store elements in the first array without changing the state of the remainder of the control store elements in the first array.

2. A two-dimensional configurable logic array comprising:
   a plurality of configurable logic elements, each of the configurable logic elements including at least one logic gate, having at least two configuration states, and responsive to a configuration control signal;
   a plurality of control store elements arranged such that each of the control store elements is associated with a particular row and column of the array, and such that each of the control store elements is coupled to a particular one of the configurable logic elements;
   each of the control store elements being programmable into at least two states, and having means for outputting one of the configuration control signals; and
   means for programming a subset of the control store elements without substantially disrupting the configuration control signals outputted by others of the control store elements.

3. A two-dimensional configurable logic array as in claim 2, wherein each of the control store elements includes a bistable latch.

4. A two-dimensional configurable logic array as in claim 2, wherein the means for programming comprises:
   row decode means for selectively coupling electrical signals to the control store elements associated with a particular row of the array; and
   column decode means for selectively coupling electrical signals to the control store elements associated with a particular column of the array.

5. A two-dimensional configurable logic array as in claim 4, wherein at least one of the row or the column decode means includes means for temporarily storing the states of some of the subset of the control store elements during a programming operation.

6. A two-dimensional configurable logic array as in claim 2, wherein the means for programming comprises:
   row decode means including a plurality of word lines, each word line connecting to the control store elements in a single row of the array; and
   column decode means including a plurality of bit lines, each bit line connecting to the control store elements in a single column of the array.

7. A two-dimensional configurable logic array as in claim 6, wherein each of the control store elements comprises:
   a bistable latch having two states and providing the configuration control signal;
   a write switch responsive to one of the word lines to connect the bistable latch to one of the bit lines;
   a read switch responsive to one of the word lines to connect the bistable latch to one of the bit lines; and
   a read buffer disposed between the bistable latch and the read switch.

8. A two-dimensional configurable logic array as in claim 7, wherein the column decode means further comprises:
   means for connecting said one of the bit lines to a data line; and
   means for temporarily storing and maintaining signals on others of the bit lines.

9. A two-dimensional configurable logic array as in claim 6, wherein each of the control store elements comprises:
- a bistable latch having two states and providing the configuration control signal;
- a switch responsive to a selected one of the word lines to connect the bistable latch to a selected one of the bit lines; and
- a buffer coupled to the configuration control signal, and generating therefrom a buffered figuration control signal.

10. A two-dimensional configurable logic array as in claim 9, wherein the plurality of bit lines are precharged before the selected one of the bit lines is connected to the bistable latch.

11. A two-dimensional configurable logic array as in claim 10, wherein the column decode means further comprises means for connecting the selected one of the bit lines to a data line.

12. A two-dimensional configurable logic array as in claim 2, wherein the means for programming comprises:
- row decode means including a plurality of read word lines and a plurality of write word lines, each said read word line and each said write word line connecting to the control store elements in a single row of the array; and
- column decode means including a plurality of bit lines and a plurality of column decode word lines, each said bit line and each said column decode word line connecting to the control store elements in a single column of the array.

13. A two-dimensional configurable logic array as in claim 12, wherein each of the control store elements comprises:
- a bistable latch having two states and providing the configuration control signal;
- a write switch;
- a read switch;
- a column decode switch responsive to one of the column decode word lines to connect the bistable latch to the read switch and the write switch;
- the write switch responsive to one of the write word lines to connect the column decode switch to one of the bit lines; and
- the read switch responsive to one of the read word lines to connect the column decode switch to one of the bit lines.

14. A two-dimensional configurable logic array as in claim 13, wherein the column decode means further comprises means for connecting said one of the bit lines to a data line.

15. A two-dimensional configurable logic array as in claim 13, wherein the impedance of the read switch when the read switch is conducting is higher than the impedance of the write switch when the write switch is conducting.

16. A two-dimensional configurable logic array as in claim 2, wherein the means for programming comprises:
- row decode means including a plurality of row decode word lines, each said row decode word line connecting to the control store elements in a single row of the two-dimensional array; and
- column decode means including a plurality of bit lines and a plurality of column decode word lines, each of the bit lines and each of the column decode word lines connecting to the control store elements in a single column of the two-dimensional array.

17. A two-dimensional configurable logic array as in claim 16, wherein each of the control store elements comprises:
- a bistable latch having two states and providing the configuration control signal;
- a row decode switch;
- a column decode switch;
- the row decode switch responsive to one of the row decode word lines to connect the column decode switch to a selected one of the bit lines; and
- the column decode switch responsive to one of the column decode word lines to connect the bistable latch to the row decode switch.

18. A two-dimensional configurable logic array as in claim 17, wherein the plurality of bit lines are precharged before the selected one of the bit lines is connected to the column decode switch.

19. A two-dimensional configurable logic array as in claim 18, wherein the column decode means further comprises means for connecting the selected one of the bit lines to a data line.

* * * * *